United States Patent
Chen et al.

(10) Patent No.: US 7,391,073 B2
(45) Date of Patent: Jun. 24, 2008

(54) NON-VOLATILE MEMORY STRUCTURE AND METHOD OF FABRICATING NON-VOLATILE MEMORY

(75) Inventors: Tsung-Lung Chen, Taichung County (TW); Hui-Hung Kuo, Kaohsiung County (TW); Cheng-Yuan Hsu, Hsinchu (TW); Chih-Wei Hung, Hsin-chu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 324 days.

(21) Appl. No.: 11/162,497

(22) Filed: Sep. 13, 2005

(65) Prior Publication Data

US 2006/0172491 A1    Aug. 3, 2006

(30) Foreign Application Priority Data

Jan. 28, 2005    (TW)    ............................. 94102599 A

(51) Int. Cl.
*H01L 29/788*    (2006.01)
*H01L 21/336*    (2006.01)

(52) U.S. Cl. .............................. 257/315; 257/E27.103; 257/E21.691; 257/E29.301; 438/257; 438/593

(58) Field of Classification Search ......... 257/315–316, 257/319–320, 326, E21.691, E29.3, E27.103; 438/257, 265, 267, 593

See application file for complete search history.

(56) References Cited

U.S. PATENT DOCUMENTS

| | | | | |
|---|---|---|---|---|
| 5,610,091 A | * | 3/1997 | Cho | 438/259 |
| 5,932,910 A | * | 8/1999 | Hong | 257/321 |
| 6,146,946 A | * | 11/2000 | Wang et al. | 438/264 |
| 6,262,452 B1 | * | 7/2001 | Ono et al. | 257/316 |
| 6,288,423 B1 | * | 9/2001 | Sugaya | 257/315 |
| 6,335,243 B1 | * | 1/2002 | Choi et al. | 438/257 |
| 6,589,842 B2 | * | 7/2003 | Huang | 438/261 |
| 2002/0187608 A1 | * | 12/2002 | Tseng | 438/257 |
| 2004/0232473 A1 | * | 11/2004 | Hsu et al. | 257/315 |
| 2006/0170028 A1 | * | 8/2006 | Jeon et al. | 257/314 |
| 2006/0275985 A1 | * | 12/2006 | Chuang et al. | 438/257 |

* cited by examiner

*Primary Examiner*—M. Wilczewski
*Assistant Examiner*—Toniae M. Thomas
(74) *Attorney, Agent, or Firm*—Jianq Chyun IP Office

(57) ABSTRACT

A method of fabricating a non-volatile memory is described. A substrate having a tunneling layer and a floating gate layer thereon is provided. A mask layer is formed on the floating gate. The mask layer has openings that expose a portion of the floating gate layer. Then, a portion of the floating gate layer is removed from the openings to form sunken regions on the surface of the floating gate layer. An inter-gate dielectric layer is formed on the floating gate layer. A control gate layer is formed on the inter-gate dielectric layer. After that, the mask layer and the floating gate layer under the mask layer are removed to form another opening. A select gate layer is formed inside the opening.

23 Claims, 3 Drawing Sheets

NON-VOLATILE MEMORY STRUCTURE AND METHOD OF FABRICATING NON-VOLATILE MEMORY

CROSS-REFERENCE TO RELATED APPLICATION

This application claims the priority benefit of Taiwan application serial no. 94102599, filed on Jan. 28, 2005. All disclosure of the Taiwan application is incorporated herein by reference.

BACKGROUND OF THE INVENTION

1. Field of the Invention

The present invention relates to a method of fabricating a memory device. More particularly, the present invention relates to a non-volatile memory structure and a method of fabricating a non-volatile memory.

2. Description of the Related Art

Non-volatile memory is a type of writable and erasable data that can be retained even after power to the device is cut off. In addition, non-volatile memory occupies a small volume and has a fast accessing speed with low power consumption. Moreover, since the data can be erased in a block-by-block mode, the operating speed is fast. Therefore, non-volatile memory has become one of the most popular memory devices in personal computers and other electronic equipment.

A typical non-volatile memory comprises a plurality of memory cells. Each memory cell has a tunneling layer, a floating gate, an inter-gate dielectric layer and a control gate layer sequentially stacked over each other. In general, the larger the gate coupling ratio (GCR) between the control gate layer and the floating gate layer, the lower the operating voltage needed to operate the memory. Consequently, manufacturers are striving hard to increase the capacitance of the inter-gate dielectric layer so that the gate coupling ratio can be increased. One way of increasing the capacitance of the inter-gate dielectric layer is to increase the overlapping area between the control gate layer and the floating gate layer. However, as the level of integration continues to increase, line width of the devices is getting smaller. Since there is very little space for increasing the overlapping area between the control gate layer and the floating gate layer, the performance of the memory device is ultimately affected.

SUMMARY OF THE INVENTION

Accordingly, at least one objective of the present invention is to provide a method of fabricating a non-volatile memory capable of increasing the gate coupling ratio and improving device performance.

To achieve this and other advantages and in accordance with the purpose of the invention, as embodied and broadly described herein, the invention provides a method of fabricating a non-volatile memory. First, a substrate having a tunneling layer and a floating gate layer thereon is provided. A mask layer is formed on the floating gate layer. The mask layer has a plurality of openings that expose a portion of the floating gate layer. Then, a portion of the floating gate layer is removed from the openings to form sunken regions on the floating gate layer. An inter-gate dielectric layer is formed on the floating gate layer. After that, a control gate layer is formed on the inter-gate dielectric layer. Finally, the mask layer and the floating gate layer under the mask layer are removed.

The present invention also provides a method of fabricating a non-volatile memory. First, a tunneling layer is formed on a substrate and then a floating gate layer is formed on the tunneling layer. Next, a mask layer is formed on the floating gate layer. The mask layer has first openings that expose a portion of the floating gate. After that, a portion of the floating gate layer is removed from the first openings to form sunken regions in the floating gate layer. An inter-gate dielectric layer is formed over the floating gate layer. Then, a control gate layer is formed on the inter-gate dielectric layer to fill the first openings. A cap layer is formed on the control gate layer. Next, the mask layer and the floating gate layer under the mask layer are removed to form second openings. A dielectric layer is formed on the sidewalls of the second openings. Finally, a select gate layer is formed inside the second openings.

According to the preferred embodiment of the present invention, the step of removing a portion of the floating gate layer to form sunken regions includes carrying out an oxidation so that the exposed floating gate layer reacts with oxygen to form an oxide layer and then removing the oxide layer. The method of removing the oxide layer includes performing a wet etching process.

According to the preferred embodiment of the present invention, after forming the control gate layer over the inter-gate dielectric layer but before removing the mask layer and the floating gate layer under the mask layer, further includes performing a thermal oxidation process to form an oxide layer on the surface of the exposed control gate layer.

According to the preferred embodiment of the present invention, after removing the mask layer and the floating gate layer under the mask layer, further includes forming a dielectric layer on the sidewalls of the floating gate layer, the inter-gate dielectric layer and the control gate layer. Then, a select gate layer is formed inside the sunken hole. The method of forming the dielectric layer includes performing a high-temperature oxidation process.

According to the preferred embodiment of the present invention, the tunneling layer can be a dielectric material such as a silicon oxide layer. The floating gate layer, the control gate layer and the select gate layer can be a conductive material such as polysilicon or doped polysilicon. Furthermore, the mask layer can be a material, such as silicon nitride, having an etching selectivity that differs from the floating gate layer. In addition, the inter-gate dielectric layer can be a silicon oxide layer or an oxide/nitride/oxide composite stack, for example.

The present invention utilizes sunken regions on the surface of the floating gate layer to increase the capacitance of the inter-gate dielectric layer between the floating gate layer and the control gate. Hence, the gate-coupling ratio between the floating gate layer and the control gate is increased. As a result, device performance is improved and the voltage needed to operate the device is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
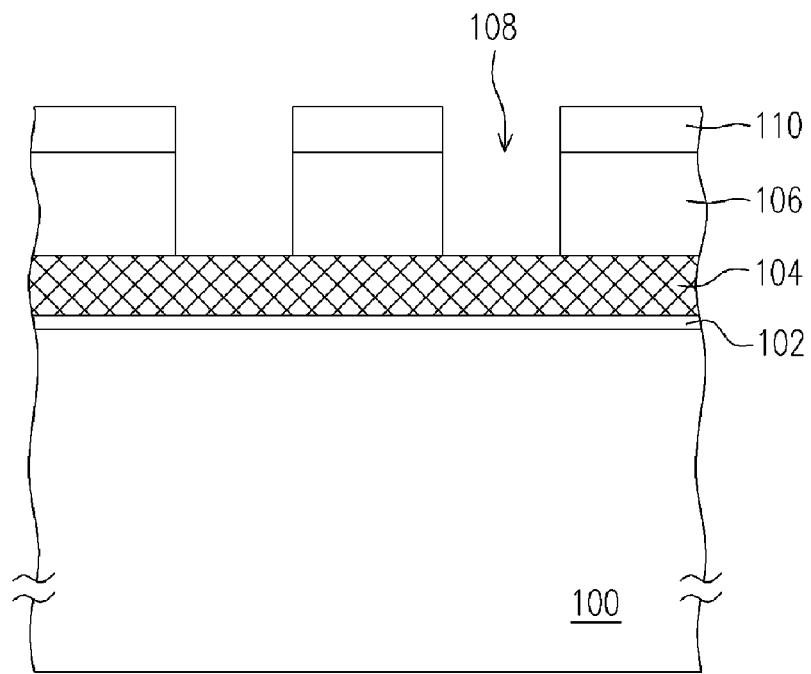
FIGS. 1A through 1F are schematic cross-sectional views showing the steps for fabricating a non-volatile memory according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the steps for fabricating a non-volatile memory according to one preferred embodiment of the present invention.

As shown in FIG. 1A, the method of fabricating a non-volatile memory in the present invention includes forming a tunneling layer 102 and a floating gate layer 104 sequentially over a substrate 100. The substrate 100 can be a silicon substrate, for example. The tunneling layer 102 can be a dielectric material including silicon oxide or other charge tunneling material, for example. The tunneling layer 102 is formed, for example, by performing a thermal oxidation process or other suitable process. Furthermore, the floating gate layer 104 can be a conductive material including polysilicon, doped polysilicon or other suitable material. The method of forming the floating gate layer 104 includes performing a chemical vapor deposition process or other suitable process.

A mask layer 106 is formed on the floating gate layer 104. The mask layer 106 has openings 108 that expose a portion of the floating gate layer 104. The mask layer 106 can be a material such as silicon nitride or other suitable material having an etching selectivity that differs from the floating gate layer 104. The method of forming the mask layer 106 includes depositing mask material to form a mask material layer (not shown) on the floating gate layer 104 and then forming a patterned photoresist layer 110 over the mask material layer. Using the patterned photoresist layer 110 as a mask, the mask material layer is etched. Finally, the patterned photoresist layer 110 is removed to form a structure as shown in FIG. 1B.

Figure 1B:
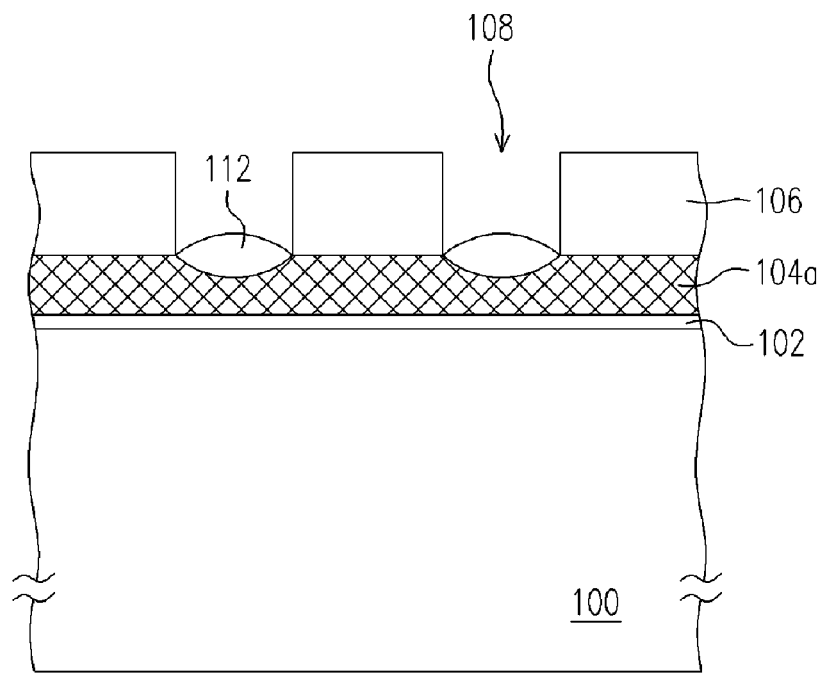
Figure 1C:
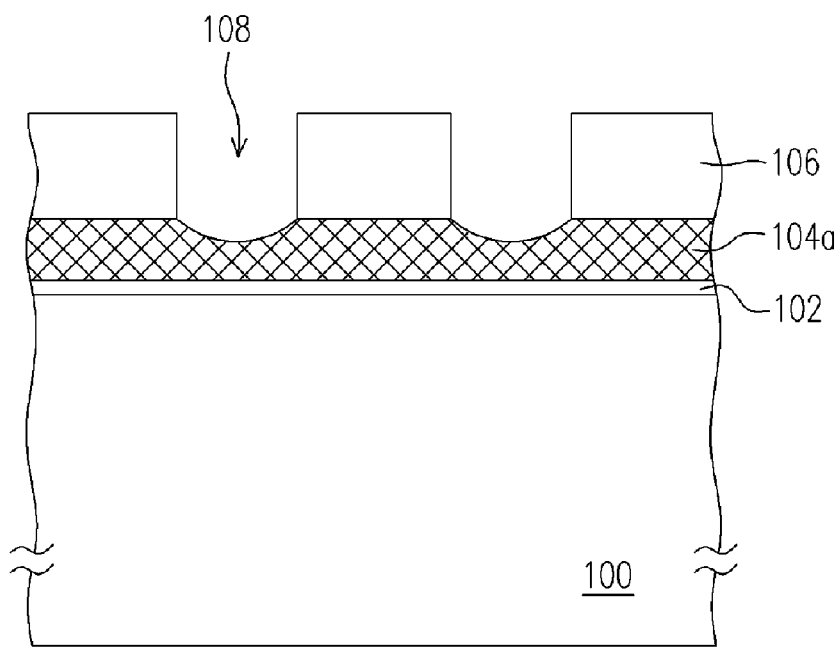

Next, referring to the structure in FIG. 1B, sunken regions are formed on the surface of the floating gate layer 104 exposed by the openings 108. For example, an oxidation process is carried out so that oxygen can react with the silicon material on the floating gate layer 104 to form a silicon oxide layer 112. After removing the silicon oxide layer 112, sunken regions are formed on the surface of a floating gate layer 104a as shown in FIG. 1C. The method of removing the silicon oxide layer 112 includes performing a wet etching process using hydrofluoric acid solution as the etchant, for example.

Note that other etching process could be used to form sunken regions on the surface of the floating gate layer aside from the aforementioned process. In other words, the oxidation and etching process described in the aforementioned embodiment should be regarded as an example only and should by no means limit the method of forming sunken regions on the floating gate layer as such.

Figure 1D:
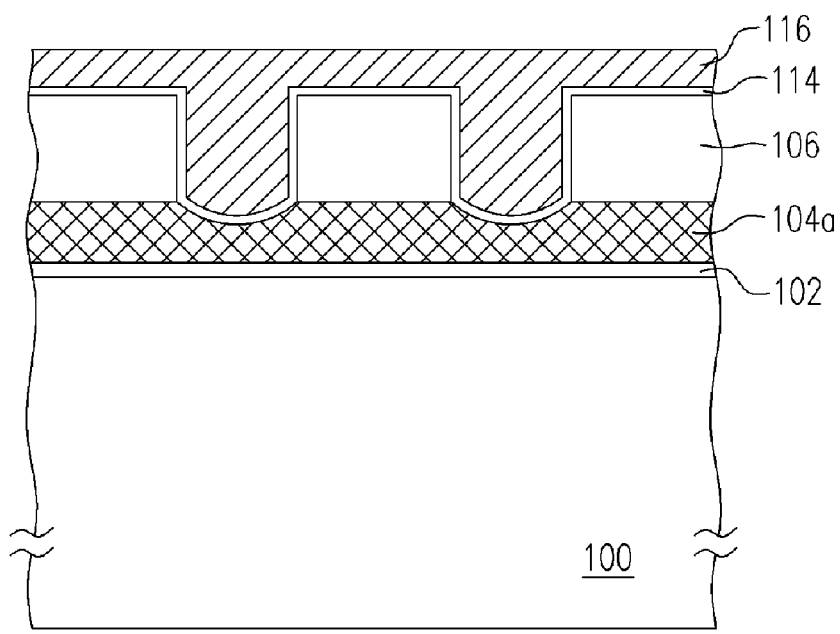

As shown in FIG. 1D, an inter-gate dielectric layer 114 is formed on the floating gate layer 104a. The inter-gate dielectric layer 114 is a silicon oxide layer, an oxide/nitride/oxide composite stack or other suitable material layer, for example.

Then, a control gate material layer 116 is formed on the inter-gate dielectric layer 114. The control gate material layer 116 can be a conductive material such as polysilicon, doped polysilicon or other suitable material. In addition, the method of forming the control gate material layer 116 includes, for example, performing a chemical vapor deposition process of other suitable process.

Figure 1E:
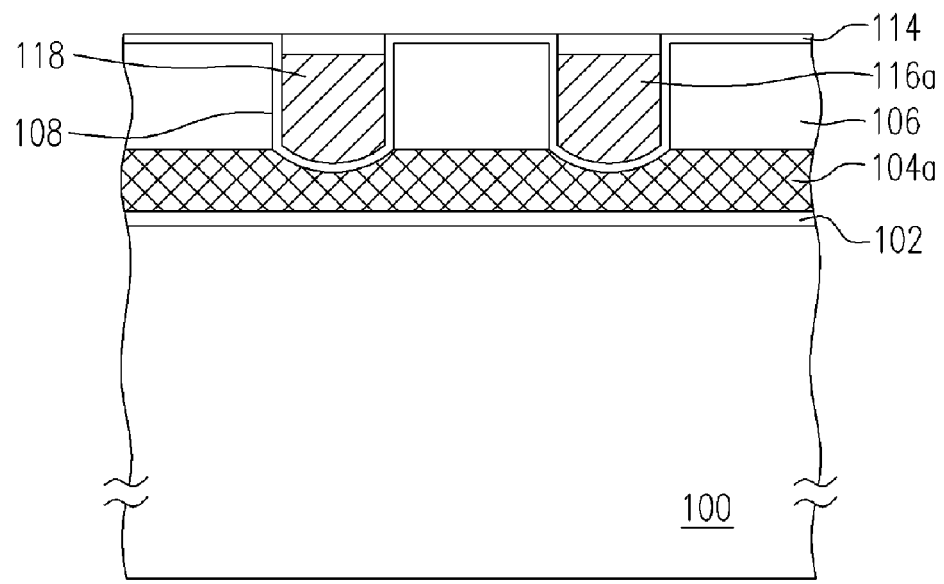

As shown in FIG. 1E, the control gate material layer 116 outside the openings 108 is removed to form control gate layers 116a. The method of removing the control gate material layer 116 includes performing a chemical mechanical polishing operation or an etching back process using the inter-gate dielectric layer 114 as a polishing stop or etching stop layer.

Next, an oxidation process is carried out to form an oxide layer 118 on the exposed control gate layer 116a. The oxidation process is a thermal oxidation process, for example. For example, if the control gate layer 116a is a polysilicon layer, then the oxide layer 118 formed after the oxidation process is a silicon oxide layer. The oxide layer 118 serves as a cap layer to protect the underlying film layer in a subsequent operation.

Figure 1F:
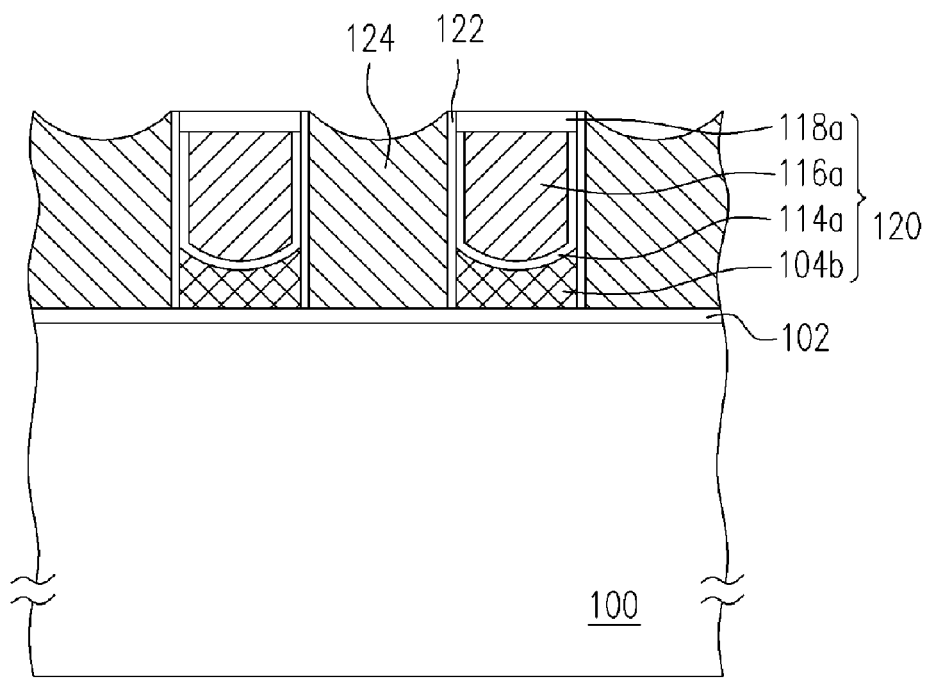

As shown in FIG. 1F, the mask layer 106 and the floating gate layer 104a under the mask layer 106 are removed so that the inter-gate dielectric layer 114 and the oxide layer 118 above the mask layer 106 are also removed. Hence, a stack layer 120 comprising a floating gate layer 104b, an inter-gate dielectric layer 114a, a control gate layer 116a and an oxide layer 118a is formed. The method of removing the mask layer 106 and the floating gate layer 104a includes performing an etching process, for example.

In one embodiment, a dielectric layer 122 is also formed on the sidewalls of the stack layer 120. The dielectric layer 122 is a silicon oxide layer or other suitable material layer formed, for example, by performing a high-temperature oxidation (HTO) or other suitable process. After that, a conductive layer 124 is formed on the dielectric layer 122, the original location of the removed mask layer 106, the floating gate layer 104a, the inter-gate dielectric layer 114 and the oxide layer 118. In particular, the dielectric layer 122 may serve as an inter-gate dielectric layer that provides a path for the movement of electric charges in a memory erase operation. In addition, the conductive layer 124 may serve as a select gate.

In summary, the present invention utilizes sunken regions on the surface of the floating gate layer to increase the capacitance of the inter-gate dielectric layer between the floating gate layer and the control gate. Therefore, the gate-coupling ratio between the floating gate layer and the control gate is increased. Ultimately, device performance is improved and the voltage needed to operate the device is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising:

providing a substrate having a tunneling layer and a floating gate layer thereon;

forming a mask layer on the floating gate layer, wherein the mask layer has at least one opening that exposes a portion of the floating gate layer;

removing a portion of the floating gate layer within the opening to form a sunken region on the surface of the floating gate layer;

forming an inter-gate dielectric layer on the mask layer and the floating gate layer;

forming a control gate layer on the inter-gate dielectric layer within the opening; and removing the mask layer, the inter-gate dielectric layer on the mask layer, and the floating gate layer under the mask layer.

2. The method of claim 1, wherein the step of removing a portion of the floating gate layer within the opening to form the sunken region on the surface of the floating gate layer comprises:
performing an oxidation process so that the exposed floating gate layer reacts with oxygen to form an oxide layer, wherein the oxide layer has a material composition different from the floating gate layer; and
removing the oxide layer.

3. The method of claim 2, wherein the process of removing the oxide layer includes performing a wet etching operation.

4. The method of claim 1, after forming the control gate layer on the inter-gate dielectric layer but before removing the mask layer and the floating gate layer under the mask layer, further comprising forming an oxide layer on the surface of the exposed control gate layer.

5. The method of claim 4, wherein the step for forming an oxide layer on the surface of the exposed control gate layer includes performing a thermal oxidation process.

6. The method of claim 1, after removing the mask layer, the inter-gate dielectric layer on the mask layer, and the floating gate layer under the mask layer, further comprising:
forming a dielectric layer on the sidewalls of the floating gate layer, the inter-gate dielectric layer and the control gate layer; and
forming a conductive layer on the dielectric layer.

7. The method of claim 6, wherein a material constituting the conductive layer comprises polysilicon or doped polysilicon.

8. The method of claim 1, wherein the floating gate layer or the control gate layer is composed of polysilicon or doped polysilicon.

9. The method of claim 1, wherein the mask layer is composed of a material having an etching selectivity different from the floating gate layer.

10. The method of claim 9, wherein the material comprises silicon nitride.

11. The method of claim 1, wherein the inter-gate dielectric layer comprises a silicon oxide layer or an oxide/nitride/oxide composite stack.

12. A method of fabricating a non-volatile memory, comprising:
providing a substrate;
forming a tunneling layer on the substrate;
forming a floating gate layer on the tunneling layer;
forming a mask layer on the floating gate layer, wherein the mask layer has at least one first opening that exposes a portion of the floating gate;
removing a portion of the floating gate layer within the first opening to form a sunken region on the surface of the floating gate layer;
forming an inter-gate dielectric layer on the floating gate layer;
forming a control gate layer on the inter-gate dielectric layer to fill up the first opening forming a cap layer on the control gate layer;
removing the mask layer and the floating gate layer under the mask layer to form at least one second opening;
forming a dielectric layer on the sidewalls of the second opening; and
forming a select gate layer within the second opening.

13. The method of claim 12, wherein the step for removing a portion of the floating gate layer within the first opening to form a sunken region on the surface of the floating gate layer comprises:
performing an oxidation process so that oxygen reacts with the exposed floating gate layer to form an oxide layer, wherein the oxide layer has a material composition different from the floating gate layer; and
removing the oxide layer.

14. The method of claim 13, wherein the process of removing the oxide layer includes performing a wet etching process.

15. The method of claim 12, wherein the step for forming the cap layer on the control gate layer comprises performing a thermal oxidation process.

16. The method of claim 12, wherein the floating gate layer, the control gate layer or the select gate layer is composed of polysilicon or doped polysilicon.

17. The method of claim 12, wherein the mask layer is composed of a material having an etching selectivity different from the floating gate layer.

18. The method of claim 17, wherein the material comprises silicon nitride.

19. The method of claim 12, wherein the inter-gate dielectric layer comprises a silicon oxide layer or an oxide/nitride/oxide composite stack.

20. A non-volatile memory structure, comprising:
a substrate having a tunneling layer thereon;
at least one stack layer disposed on the tunneling layer, wherein the stack layer comprises:
a floating gate layer disposed on the tunneling layer;
a first inter-gate dielectric layer disposed on the floating gate layer;
a control gate layer disposed on the first inter-gate dielectric layer, wherein a contact surface between the floating gate layer and the control gate layer is concave, and the first inter-gate dielectric layer is disposed between the control gate layer and the floating gate layer; and
an oxide layer disposed on the control gate layer;
at least one conductive layer disposed on the tunneling layer and next to the stack layer, wherein the conductive layer contacts the tunneling layer directly; and
at least one second inter-gate dielectric layer disposed on sidewalls of the stack layer and between the conductive layer and the stack layer.

21. The structure of claim 20, wherein a material of the conductive layer, the floating gate layer and the control gate layer is composed of polysilicon or doped polysilicon.

22. The structure of claim 20, wherein the first and second inter-gate dielectric layer comprises a silicon oxide layer or an oxide/nitride/oxide composite stack.

23. The structure of claim 20, wherein the conductive layer is a select gate.

* * * * *